(12) United States Patent
Trinh et al.

(10) Patent No.: US 9,978,938 B2
(45) Date of Patent: May 22, 2018

(54) RESISTIVE RAM STRUCTURE AND METHOD OF FABRICATION THEREOF

(71) Applicant: Taiwan Semiconductor Manufacturing Company, Ltd., Hsin-Chu (TW)

(72) Inventors: Hai-Dang Trinh, Hsinchu (TW); Cheng-Yuan Tsai, Chu-Pei (TW); Hsing-Lien Lin, Jinshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 14/941,037

(22) Filed: Nov. 13, 2015

(65) Prior Publication Data

US 2017/0141300 A1    May 18, 2017

(51) Int. Cl.
| | | |
|---|---|---|
| *H01L 47/00* | (2006.01) | |
| *H01L 45/00* | (2006.01) | |
| *H01L 27/24* | (2006.01) | |

(52) U.S. Cl.
CPC .......... *H01L 45/08* (2013.01); *H01L 45/1233* (2013.01); *H01L 45/1253* (2013.01); *H01L 45/146* (2013.01); *H01L 45/16* (2013.01); *H01L 45/1608* (2013.01); *H01L 45/1675* (2013.01); *H01L 27/2436* (2013.01)

(58) Field of Classification Search
CPC . H01L 45/08; H01L 45/1233; H01L 45/1253; H01L 45/1608; H01L 45/04; H01L 27/24; H01L 45/144; H01L 45/06; H01L 45/146; H01L 27/2436
See application file for complete search history.

(56) References Cited

U.S. PATENT DOCUMENTS

| | | | |
|---|---|---|---|
| 6,573,150 B1 * | 6/2003 | Urdahl | H01L 21/31604 257/E21.008 |
| 8,593,854 B1 | 11/2013 | Chih et al. | |
| 8,869,436 B2 | 10/2014 | Tsai et al. | |
| 9,246,091 B1 * | 1/2016 | Wang | H01L 45/1253 |
| 9,577,191 B2 * | 2/2017 | Dang | H01L 45/1616 |
| 2003/0025146 A1 * | 2/2003 | Narwankar | H01L 28/40 257/310 |
| 2011/0076826 A1 * | 3/2011 | Cheng | H01L 45/04 438/382 |
| 2011/0233502 A1 * | 9/2011 | Shigeoka | H01L 27/2409 257/2 |
| 2012/0145986 A1 * | 6/2012 | Yasutake | H01L 27/2409 257/4 |

(Continued)

FOREIGN PATENT DOCUMENTS

WO    WO 2010115924 A1 * 10/2010 ......... H01L 45/1633

*Primary Examiner* — Latanya N Crawford

(74) *Attorney, Agent, or Firm* — Haynes and Boone, LLP

(57) ABSTRACT

A metal-insulator-metal (MIM) capacitor structure of an RRAM device includes a first electrode and a second electrode with an insulating layer interposing the first and second electrodes. The conductive filament providing for a switching function of the RRAM device may be formed within the insulating layer. Further, a nitrogen-rich metal layer interposes the second electrode and the insulating layer. The nitrogen-rich metal layer includes a greater nitrogen concentration than that of the adjacent second electrode.

20 Claims, 18 Drawing Sheets

(56) References Cited

U.S. PATENT DOCUMENTS

| | | | |
|---|---|---|---|
| 2013/0214236 A1* | 8/2013 | Lu | H01L 45/08 257/4 |
| 2013/0234094 A1 | 9/2013 | Chang et al. | |
| 2013/0294145 A1* | 11/2013 | Sandhu | H01L 45/08 365/148 |
| 2013/0336041 A1 | 12/2013 | Tsai et al. | |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0162529 A1* | 6/2015 | Lee | H01L 45/1253 711/118 |
| 2015/0200363 A1* | 7/2015 | Sacchetto | G11C 13/0007 365/148 |
| 2016/0172420 A1* | 6/2016 | Bajaj | H01L 45/06 365/148 |

* cited by examiner

RESISTIVE RAM STRUCTURE AND METHOD OF FABRICATION THEREOF

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, and some of these involve capacitive structures. Such capacitive structures include, for example, metal-insulator-metal (MIM) capacitors. In particular, resistive random access memory (RRAM) is one technology for non-volatile memory devices built on MIM capacitor structures. In an RRAM device, each RRAM cell (MIM cap) includes a resistive material layer, the resistance of which can be adjusted to represent a logic value by switching the device between a low resistance and high resistance state.

One typical operation of an RRAM cell involves making the resistive material layer a conductor through formation of a conductive filament (conduction path) by applying of a sufficiently high electric field. Once the filament is formed, it may be reset (broken, resulting in high resistance) or set (re-formed, resulting in lower resistance). In one example, the conduction through the MIM stack and the conductive filament is by defects in the resistive material layer, known as oxygen vacancies (oxide bond locations where the oxygen has been removed), which can subsequently charge and drift under an electric field. In other words, the conductive filament forms an oxygen vacancy bridge through the MIM cap stack. Resetting the RRAM to a high resistance state provides for the recombination of the oxygen ions with the oxygen vacancies thereby disrupting the bridge.

One advantage of these and other MIM cap devices is their compatibility with CMOS fabrication processes. Current fabrication methods and structures for using MIM caps as RRAM devices, including those implicating the formation and preservation of the filament, while suitable in many respects, can struggle to meet the desired performance and reliability criteria.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
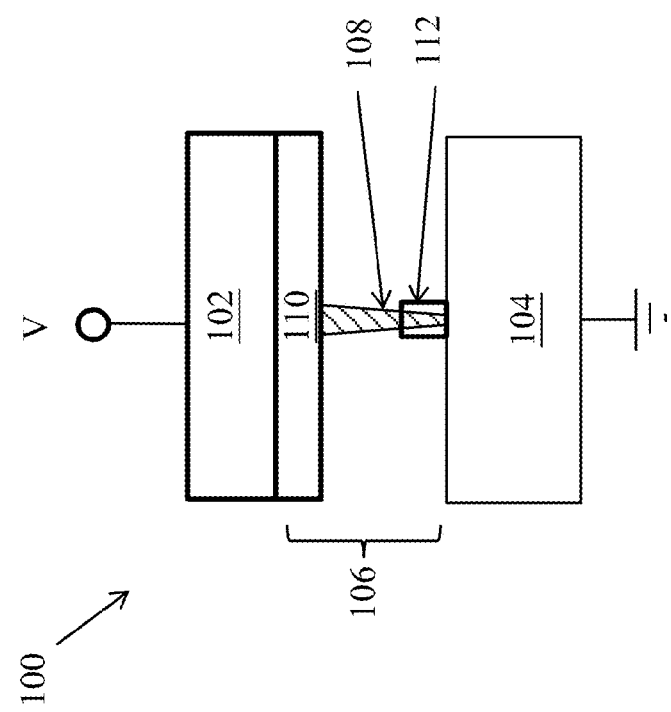
FIG. 1 illustrates a schematic representation of a metal-insulator-metal (MIM) structure for an RRAM element.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity. Further, descriptions of top/bottom, above/below, and the like are for reference and ease of description of the relative positioning of features and is not intended to limit to any specific orientation.

FIG. 1 illustrates a schematic representation of a MIM capacitor 100. The MIM capacitor 100 may be a portion of a non-volatile memory (NVM) cell. The MIM capacitor 100 may be a resistive random access memory (RRAM) element. An RRAM device such as the MIM capacitor 100 may be used to hold a binary piece of data, or a bit, by altering the properties of an intermediate dielectric layer in memory elements in such a way so as to alter the resistance of the layer. A bit may be encoded by setting the resistance of the dielectric layer to a relatively high resistance state or a relatively low resistance state, with a value of one assigned to one state and a value of zero assigned to the other state.

Under this example, the MIM capacitor 100 includes a top electrode 102 and a bottom electrode 104. A switching element 106, a dielectric layer, is disposed between the top electrode 102 and the bottom electrode 104. The MIM capacitor 100 is illustrated after the soft dielectric breakdown of the dielectric layer of the switching element 106 occurs, thereby forming a conductive filament 108 in the dielectric layer interposing the electrodes. The top electrode 102 is coupled to a voltage source V, the bottom electrode 104 is coupled to ground (e.g., V=0). The conductive filament 108 is formed by providing a $V_{forming}$ voltage to V.

In an embodiment, during the formation process, a soft dielectric breakdown of a dielectric layer of the switching element 106 occurs and oxygen ions drive toward the top electrode 102 (also referred to as the anode). This provides an interface at the top electrode 102 that acts as an "oxygen reservoir" 110. The oxygen reservoir 110 may be an interfacial oxide layer (e.g., having reacted with a metal of the electrode or other interposing layer) or oxygen maintained as neutral non-lattice oxygen. When the MIM capacitor 100 is in a low-resistance state, the current flows through the conductive filament 108 of the dielectric material. During the reset process, oxygen ions migrate back to the conductive filament 108 from the reservoir 110, and recombine with the oxygen vacancies thereby providing a high resistance state for the MIM capacitor 100.

As illustrated in FIG. 1, during operation of the MIM capacitor 100, the inventors have recognized that a build-up of oxygen atoms may occur in the switching element 106 and in the conductive filament 108, illustrated as oxygen capture region 112. It is suspected that the lower electrode 104 acts to attract oxygen creating the oxygen capture region 112; however, the present disclosure is not bound to this theory. The oxygen capture region 112 affectively modifies the shape of the conductive filament 108, in particular, in some embodiments destroying a desired "V-shaped" filament. The oxygen capture region 112 may implicate the performance of the MIM capacitor 100 including, for example, extending the lower portion of the conductive filament 108 such that it becomes difficult for the oxygen ions to recombine during the reset process, thereby making it difficult to regain the high resistance condition for the MIM capacitor 100. This can lead to reset failures, which can in turn cause a requirement for extra bits to be disposed on the SOC to compensate. The oxygen capture region 112 also can also implicate the performance and reliability of the MIM capacitor 100 by leading to a higher probability of conductive filament 108 failures during the operation and testing (e.g., cycling and baking) of the MIM capacitor 100. Such a conductive filament 108 failure can cause a high bit error rate for the SOC and reset/set current shift. For example, after cycling and baking (e.g., 100K cycles, 100 cycles of baking at 250 C for reliability testing) the set/reset current can shift; this shifting can narrow the switching window (e.g., the difference between set current and reset current or "0" and "1").

In order to address this oxygen capture region and/or other issues in the fabrication and operation of MIM capacitors such as MIM capacitor 100, some embodiments of the devices and methods are provided herein provide a nitrogen composition profile of a MIM capacitor that impacts the oxygen migration.

Figure 2:
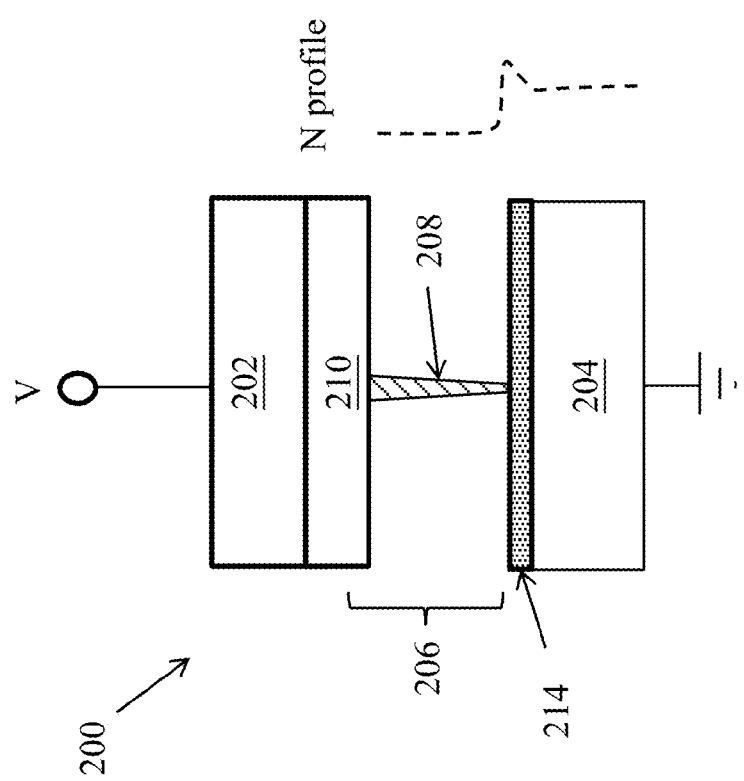
FIG. 2 illustrates a schematic representation of functional elements of a metal-insulator-metal (MIM) structure for an RRAM element according to one or more aspects of the present disclosure.

Referring to the example of FIG. 2, illustrated is a schematic representation of a MIM capacitor 200. The MIM capacitor 200 may be a portion of a non-volatile memory (NVM) cell. For example, the MIM capacitor 200 may be a resistive random access memory (RRAM) element. In some embodiments, the MIM capacitor 200 is disposed on a substrate with a plurality of functional devices including for example, logic circuitry that controls the reading and/or writing functions of a memory cell including the MIM capacitor 200.

An RRAM cell such as the MIM capacitor 200 may be used to hold a binary piece of data, or a bit, by altering the properties of an intermediate dielectric layer in memory elements in such a way so as to alter the resistance of the layer. A bit may be encoded by setting the resistance of the dielectric layer to a relatively high resistance state or a relatively low resistance state, with a value of one assigned to one state and a value of zero assigned to the other state.

The MIM capacitor 200 includes a top electrode 202 and a bottom electrode 204. Each of the top electrode 202 and the bottom electrode 204 are connected to additional conductive layers (e.g., interconnect line(s) and/or vias). In some examples, the MIM capacitor 200 is formed in back-end-of-the-line (BEOL) processing of a semiconductor device, for example, formed within the upper metallization layers (e.g., metal 4 (M4), metal 5 (M5), etc.) of a device. This is discussed in further detail below. Through the metallization, the top electrode 202 is coupled to a voltage source V, the bottom electrode 204 may be coupled to ground (e.g., V=0). Additional layers that make up the stack for the MIM cap 200 provided by the schematic of FIG. 2 may be as illustrated and described with reference to FIG. 3 as discussed below.

An insulating (also referred to as a dielectric layer or resistive layer) interposes the top electrode 202 and the bottom electrode 204. The dielectric layer performs as a switching element 206, which provides the "switching" between resistive states for the MIM capacitor 200. The schematic of the MIM capacitor 200 is illustrated after the soft dielectric breakdown of the dielectric layer of the switching element 208 occurs, thereby forming a conductive filament 208 within a resistive layer interposing the electrodes. The conductive filament 208 is formed by providing a $V_{forming}$ voltage to V. In an embodiment, the conductive filament provides a conductive path of oxygen vacancies from the top electrode 202 to the bottom electrode 204.

In an embodiment, during the formation process of the filament, oxygen ions of the switching element drive toward the top electrode 202 (also referred to as the anode). This provides an interface at the top electrode 202 that acts as an oxygen reservoir 210. The oxygen reservoir 210 may include oxygen in an interfacial oxide layer (e.g., having reacted with a metal of the electrode, capping layer, or other interposing layer) or oxygen maintained as neutral non-lattice oxygen. When the MIM capacitor 200 is in a low-resistance state, the current flows through the conductive filament 208 of the dielectric material. During the reset process, oxygen ions migrate back to the conductive filament 208 from the reservoir 210, and recombine with the oxygen vacancies thereby providing a high resistance state for the MIM capacitor 200. This operation is provided as exemplary only and other operation mechanisms for the MIM capacitor 200 are also possible and within the scope of the present disclosure. For example, this and other mechanisms for resistive switching elements of RRAM devices is discussed in "Metal-Oxide RRAM" by H. S. Philip Wong, et al., Proceedings of the IEEE, Vol. 100, No. 6, June 2012, which is hereby incorporated by reference in its entirety.

As illustrated in FIG. 2, the nitrogen profile (atomic percentage of nitrogen in a given portion of the stack of the MIM capacitor 200) is increased (illustrated by the profile extending to the right of FIG. 2) at a lower portion of the conductive filament. In particular, the nitrogen profile is varied such that a nitrogen-rich region 214 is disposed on an end of the conductive filament 208 opposing the oxygen reservoir 210. In an embodiment, the nitrogen rich region 214 may act to suppress attraction of oxygen by the electrode 204. As illustrated by the dashed line profile in FIG. 2, in an embodiment, the nitrogen concentration is substantially constant at a first level in the switching element (e.g., dielectric layer), increased to a second level in the nitrogen-rich region 214, and decreased from the second level to a third level in the electrode 204 (and/or (the third level described above) may be substantially constant. In an embodiment, the third level is greater than the first level.

A "nitrogen-rich region" is one in which the atomic percentage of nitrogen is greater than the stoichiometric atomic percentage. For example, in a TiN layer the stoichiometric ratio of N to Ti is [1]:[1]. A nitrogen-rich TiN region is one in which the ratio of N to Ti is [greater than 1]:[1]. A "metal-rich" composition is one having an atomic percentage of a metal greater than stoichiometric atomic percentage.

In an embodiment, the nitrogen-rich region 214 is a nitrogen-rich metal nitride (N-rich XN, where X is a metal atom) layer and the electrode 204 is a metal nitride (XN) or metal-rich metal nitride (X-rich XN). For example, in an embodiment, the nitrogen-rich region includes nitrogen-rich TiN and the adjacent electrode 204 includes a titanium-rich TiN.

In an embodiment, the nitrogen-rich region 214 has at least a 5% greater atomic percentage of nitrogen than the composition of the electrode 204. In an embodiment, atomic relationship N/X is in the range of 1 to approximately 1.2 in the nitrogen-rich region 214. In a further embodiment, the N/X of nitrogen-rich region 214 is greater than 1, e.g., the stoichiometric value. In an embodiment, the nitrogen-rich region 310 includes TiN having excess N over the stoichiometric TiN, or TiNx, for example, where x is approximately 1.2. In an embodiment, atomic relationship N/X is in the range of approximately 0.90 to 0.98 in the electrode 204. In an embodiment, the nitrogen-rich region 214 has greater than 0 to approximately 10% excess nitrogen (atomic percentage of N greater than the stoichiometric ratio of N for the given metal nitride). The atomic ratio of nitrogen and metal may be determined by suitable measurement techniques such as X-ray photoelectron spectroscopy (XPS).

In an embodiment, the metal X of the nitrogen-rich region 214 and/or the electrode 204 is Ti. Other exemplary metals for metal X include Ta, Hf, Xr, W, Nb, Mo, and/or other suitable compositions. In some embodiments, the electrode 204 has the same metal as the nitrogen-rich region 214. In other embodiments, the electrode 204 has a different metal than the nitrogen-rich region 214. In an embodiment, the nitrogen-rich region includes nitrogen rich compositions of TaN, TiN, HfN, Zr, N, WN, NbN, MoN, and/or other suitable metal nitrides. In an embodiment, the underlying electrode 204 includes a composition of a TaN, TiN, HfN, Zr, N, WN, NbN, MoN, and/or other suitable metal nitrides, with a decreased nitrogen-concentration (e.g., metal rich or stoichiometric compositions).

The nitrogen-rich region 214 and/or the electrode 204 may be tuned in doping amounts and/or thickness to accomplish a desired functionality for the MIM capacitor 200. In an embodiment, the nitrogen-rich region is between approximately 10 and approximately 20 Angstroms in thickness. In an embodiment, the electrode 204 (e.g., metal-rich metal nitride) is between approximately 50 and 150 Angstroms. The thicknesses may be provided to allow for suitable prevention of degradation of the conductive filament 208 (e.g., prevent oxygen capture) and/or suitable contact resistance for the electrode 204. The nitrogen-rich region 214 may suitably doped to provide for maintaining a V-shaped conductive filament 208 by avoiding formation of an oxygen-capture region such as illustrated with reference to FIG. 1. In an embodiment, the reduction of nitrogen concentration in the electrode 204 (as compared to the nitrogen-rich region 214) provides for suitable contact resistance as the nitrogen-rich region 214 would exhibit a higher contact resistance.

The nitrogen-rich region 214 may be formed by implementing methods that introduce nitrogen into a surface region of the electrode 204 such as, for example, plasma treatments. In an embodiment, during the formation of the electrode 204, the deposition is controlled such that the nitrogen percentage is varied and the nitrogen-rich region 214 is thus formed in-situ with the electrode 204. These and other fabrication methods are discussed in further detail below with reference to the method of FIG. 5.

Figure 3:
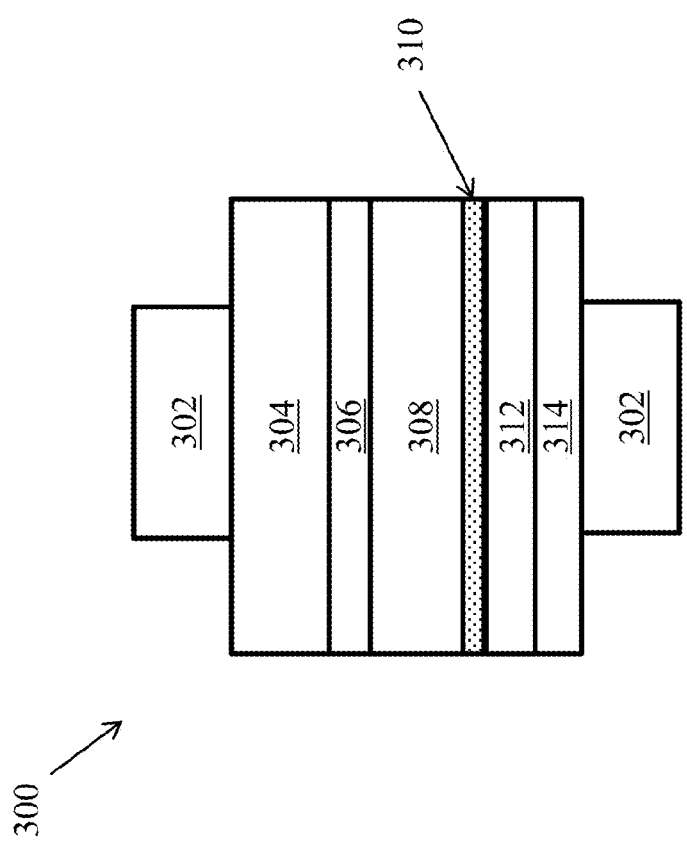
FIG. 3 illustrates a cross-sectional view of an embodiment of a MIM capacitor structure according to one or more aspects of the present disclosure.

Referring now to FIG. 3, illustrated is a cross-sectional view of the layers of a fabricated MIM capacitor stack 300. The MIM capacitor stack 300 may be substantially similar to the MIM capacitor 200, described above with reference to FIG. 2. The MIM capacitor stack 300 includes a top and bottom plug 302, a top electrode 304, a capping layer 306, a dielectric layer 308, a nitrogen-rich region 310, a bottom electrode 312 and a barrier layer 314. In other embodiments, additional layers may be added and/or layers may be omitted.

The top and bottom plug 302 may be a portion of a multi-layer interconnect (MLI) including metallization layers, vias, or contacts of the interconnect feature (e.g., back-end-of-the-line (BEOL) features) disposed on a substrate including the MIM capacitor stack 300. In an embodiment, the bottom plug 302 is a portion of and/or connected to a metallization layer Mn and the top plug 302 is a portion of and/or connected to a metallization layer Mn+1 (e.g., metal 4 and metal 5). For example, in an embodiment, the top plug 302 is a via providing connection to a given metallization layer (e.g., M5) and the bottom plug 302 is a portion of metallization line of a horizontally lower layer (e.g., M4). However, other metal layers and associated vias may also be used to provide the top and/or bottom plugs 302 depending the on desired positioning of the MIM capacitor stack 300. In an embodiment, one or more of the plugs 302 are copper. Other exemplary compositions include W, Al, and/or other suitable conductive layers. The plugs 302 may be multilayer features including, for example, liner, barrier, adhesion, and/or other suitable layers.

The top electrode 304 may include TiN, Pt, TaN, Ir, W, combinations thereof, and/or other suitable conductive material. The top electrode 304 may be substantially similar to the top electrode 202 of the MIM capacitor 200. Exemplary compositions for the capping layer 306 include Ti, Hf, Al, Ta, combinations thereof, and/or other suitable conductive compositions. The capping layer 306 and/or the top electrode 304 during the operation of the MIM capacitor 300 as an RRAM device may provide for location for an oxygen reservoir as described above with reference to FIG. 2.

The dielectric layer 308 may be an insulating layer, also referred to as the resistive layer of the MIM cap 300 as a RRAM device. In an embodiment, the dielectric layer is a high-k dielectric layer. Suitable compositions include, but are not limited to, HfO, $Ta_2O_5$, $Nb_2O_5$, $V_2O_5$, AlO, TiO, TaTiO, HfAlO, HfTaO, TaAlO, NbO/HfO, VO/HfO, TaO/HfO, AlO/HfO, TaO/AlO, combinations thereof, and/or other suitable dielectrics. The dielectric layer 308 may be used as the switching element of the MEM capacitor stack 300. In an embodiment, the dielectric layer 308 may be substantially similar to the switching element 208 of the MEM capacitor 200, described above with reference to FIG. 2. For example, a conductive filament may be formed in the dielectric layer 308.

The nitrogen-rich region 310 may be substantially similar to the nitrogen-rich region 214 of the MIM capacitor 200, described above with reference to FIG. 2. In an embodiment, the nitrogen-rich region 310 has at least a 5% greater atomic percentage of nitrogen than that of the bottom electrode 312, discussed below. In an embodiment, the nitrogen-rich region is a nitrogen-rich metal nitride (N-rich XN) layer and the electrode 312 is a metal nitride (XN) or metal-rich metal nitride (X-rich XN). In an embodiment, N/X ratio is in the range of 1.0 to 1.2 in the nitrogen-rich region 214. In a further embodiment, the N/X ratio in the nitrogen-rich region 214 is greater than 1.0. In an embodiment, N/X ratio is in the range of 0.90 to 0.98 in the electrode 204. The atomic ratio may be determined by suitable measurement techniques such as X-ray photoelectron spectroscopy (XPS). In an embodiment, the metal X is Ti. For example in one embodiment, the nitrogen-rich region 310 is nitrogen-rich TiN having an atomic N to Ti ratio of approximately 1.0 to 1.2. In a further embodiment, the nitrogen-rich region 310 has an atomic N to Ti ratio of greater than 1.0, or greater than the stoichiometric value. In a further example, the bottom electrode is Ti-rich TiN having an atomic N to Ti ratio less than the nitrogen-rich region 310, such as between approximately 0.90 to approximately 0.98. Other exemplary metals for the nitrogen-rich region 310 and/or the bottom electrode 312 include Ta, Hf, Xr, W, Nb, Mo, and/or other suitable compositions. In some embodiments, the electrode 312 has the same metal as the nitrogen-rich region 310. In other embodiments, the electrode 312 has a different metal than the nitrogen-rich region 310.

In an embodiment, the nitrogen-rich region 310 is between approximately 10 and approximately 20 Angstroms in thickness. In an embodiment, the electrode 312 (e.g., metal-rich metal nitride) is between approximately 50 and 150 Angstroms. The thicknesses may be provided to allow for suitable prevention of degradation of the conductive filament formed in the dielectric layer 308 and/or suitable contact resistance for the electrode 312.

As discussed above, the bottom electrode 312 may include TaN, TiN, HfN, ZrN, WN, NbN, MoN, combinations thereof, and/or other suitable conductive material. The barrier layer 314 may include TaN, TiN, HfN, ZrN, WN, NbN, MoN, combinations thereof, and/or other suitable conductive material. In an embodiment, the barrier layer 314 is the same composition as the bottom electrode 312. In an embodiment, the barrier layer 314 is a different composition than the bottom electrode 312. The bottom electrode 312 (or the bottom electrode 312 and the barrier layer 314) may be substantially similar to the bottom electrode 204, described above with reference to FIG. 2.

The MIM capacitor stack 300 is illustrated as a vertically formed stack; however, other configurations are possible including MIM capacitor orientation that provides for the upper and lower plugs 302 to be horizontally coplanar. Further, in some embodiments, certain layers may be added and/or omitted depending on the desired configuration of the MIM capacitor 300.

Figure 4:
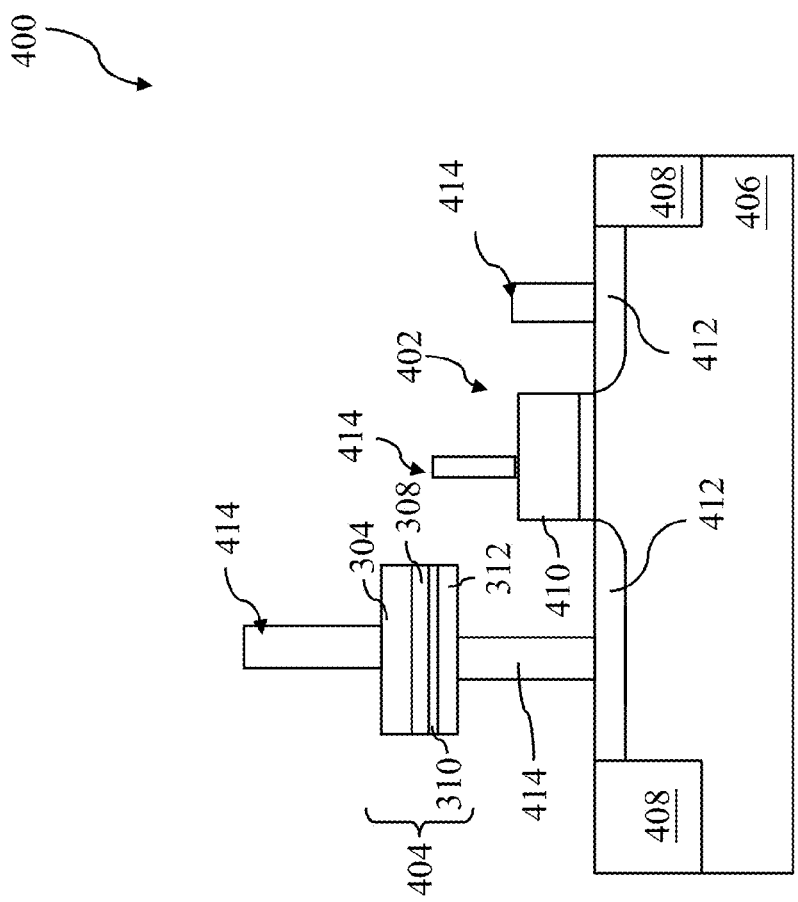
FIG. 4 illustrates a diagrammatic cross-sectional view of an embodiment of a memory cell having a RRAM device formed as a MIM capacitor structure and a FET according to one or more aspects of the present disclosure.

FIG. 4 illustrates a cross-sectional diagrammatic view of a memory cell 400 that includes a field effect transistor (FET) 402 and an MIM capacitor 404, which forms an RRAM device. The FET 402 and the MIM capacitor 404 are formed on a substrate 406 and coupled together. In one example, the substrate 406 is a semiconductor substrate, such as a silicon substrate or alternatively other suitable semiconductor substrate. Various isolation features 408, such as shallow trench isolation (STI) features are formed on the substrate 406 and define various active regions. The FET 402 includes a gate 410 disposed on the substrate 406. The gate 410 includes a gate dielectric layer and a gate electrode disposed on the gate dielectric layer. In various examples, the gate dielectric layer includes a high k dielectric material and the gate electrode includes metal. The FET 402 further includes a source and drain 412 formed in the substrate 406. The source and drain 412 may be doped regions of the substrate 406, epitaxial regions formed on the substrate 406, and/or other suitable regions providing appropriate conductivity.

The MIM capacitor 404 may be substantially similar to the MIM capacitor stack 300, described above with reference to FIG. 3. The MIM capacitor 404 may function as described above with reference to the MIM capacitor 200 of FIG. 2. The MIM capacitor 404 includes a resistive material layer 308 interposed between a top electrode 304 and a bottom electrode 312. A nitrogen-rich layer 310 interposes the bottom electrode 312 and the resistive material layer 308. The resistive material layer 308 (a dielectric layer), the nitrogen-rich layer 320, and the electrodes 304, 312 may be substantially similar to as discussed above with reference to FIG. 3. Further, including as described above with reference to the MIM capacitor stack 300 of FIG. 3, additional layers such as, for example, capping layers, barrier layers, plug layers may be included in the stack. Furthermore, the resistive material layer 308 of the MIM capacitor stack 404 may be configured to provide a filament during operation of a RRAM device including as discussed above. In an embodiment, a voltage is provided to the top electrode 304 (e.g., via conductive features 414) to form the filament for an RRAM device using the MIM capacitor 404.

The memory cell 400 also includes various conductive features 414 to provide electrical routing and connection. The conductive features 414 include metallization lines, contacts, and/or vias including those formed in a BEOL CMOS process. The conductive features 414 may be referred to multi-layer interconnect (MLI) including metallization lines, contacts, and vias connecting the metallization lines. The MIM capacitor stack 404 and the FET 402 are coupled together through one or more conductive features 414. The MIM capacitor stack 404 may be disposed further from the semiconductor substrate surface (e.g., within the overlying metallization layers) as compared to the FET 402. The conductive features 414 also provide connection to the FET 402 including the gate 410 and the source/drain region 412. The conductive features 414 may include bit lines and/or provide other functions for interconnect lines typical of a memory device.

The memory cell 400 is exemplary only and not intended to be limiting as to the devices included in a memory cell or the system-on-a-chip (SOC) to which the memory cell is connected. In other words, while a single MIM capacitor and transistor are shown, other configurations may be possible and within the scope of the present disclosure.

Figure 5:
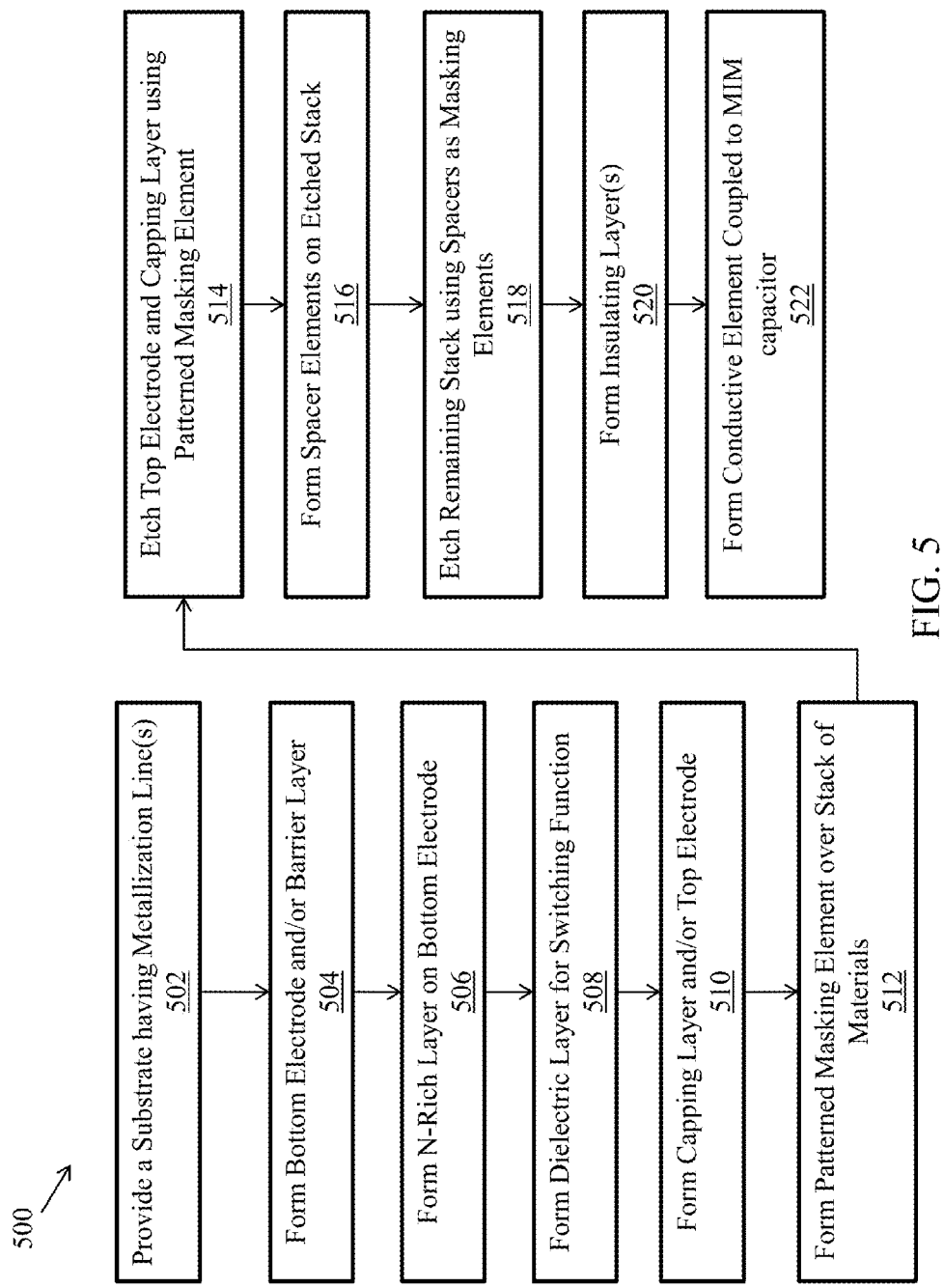
FIG. 5 illustrates a flow chart of an embodiment of a method of fabricating a MIM capacitor structure according to one or more aspects of the present disclosure.

Referring now to FIG. 5, illustrated is a method 500 for fabricating a MIM capacitor. In some embodiments, the MIM capacitor fabricated according to the disclosed method 500 may be a memory element of a resistive random-access memory (RRAM) cell and/or of a suitable type of various non-volatile computer memory cells. The MIM capacitor fabricated may be substantially similar to the MIM capacitor 200, described above with reference to FIG. 2; the MIM capacitor stack 300, described above with reference to FIG. 3; and/or the MIM capacitor 404, described above with reference to FIG. 4. It is understood that additional steps can be provided before, during, and/or after the method 500, and some of the steps described can be replaced, eliminated, and/or moved around for additional embodiments of the method 500. FIGS. 6-15 are cross-sectional views of an exemplary embodiment of device 600 formed according to one or more steps of the method 500.

The method 500 begins at block 502 where a substrate is provided. Referring to the example of FIG. 6, a substrate 602 is provided. In an embodiment, the substrate 602 is a semiconductor substrate, such as a silicon substrate or alternatively another suitable semiconductor substrate. The substrate 602 may include a plurality of features such as, field effect transistors (FETs) including gate, source and drain features; isolation features including those defining various active regions; interconnection or metallization layers (also referred to as a multi-layer interconnect (MLI)) having metal lines, contacts, and vias/or interposed by interlayer dielectric (ILD) material (also referred to as an inter-metal dielectric (IMD)); capacitor structures; and/or other devices and features typical of CMOS process technology. In an embodiment, the substrate provided in block 602 has been processed to the point that at least one metallization layer (e.g., M1, M2, etc.) has been formed in a BEOL process.

Figure 6:
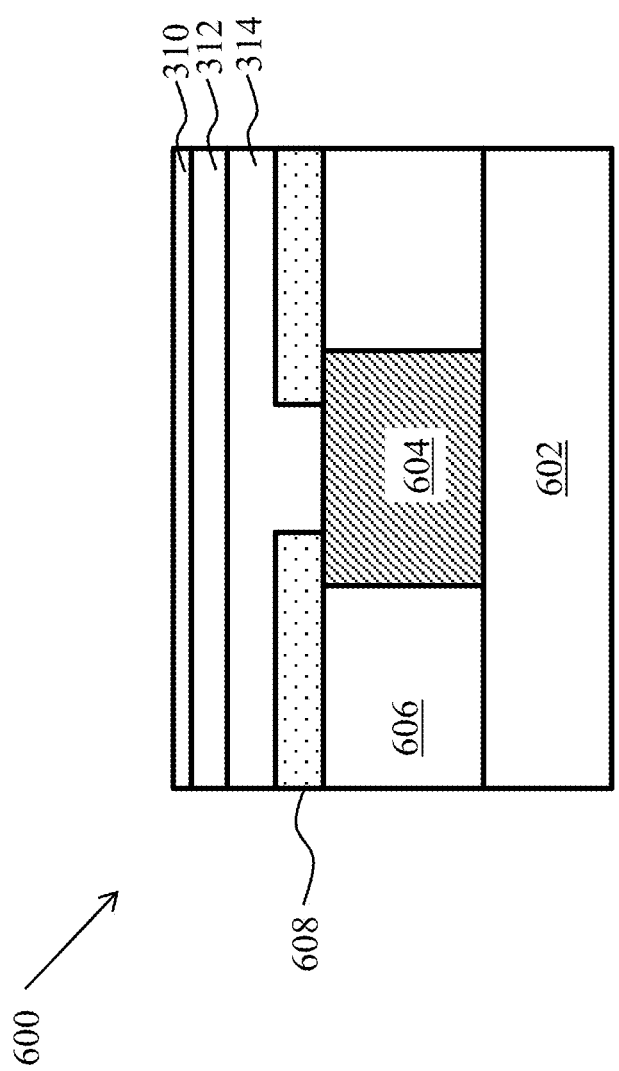
FIGS. 6, 7, 8, 9, 10, 11, 12, 13, 14, and 15 depict a cross-section of a MIM capacitor fabricated according to the steps of the method of FIG. 5.
Figure 7:
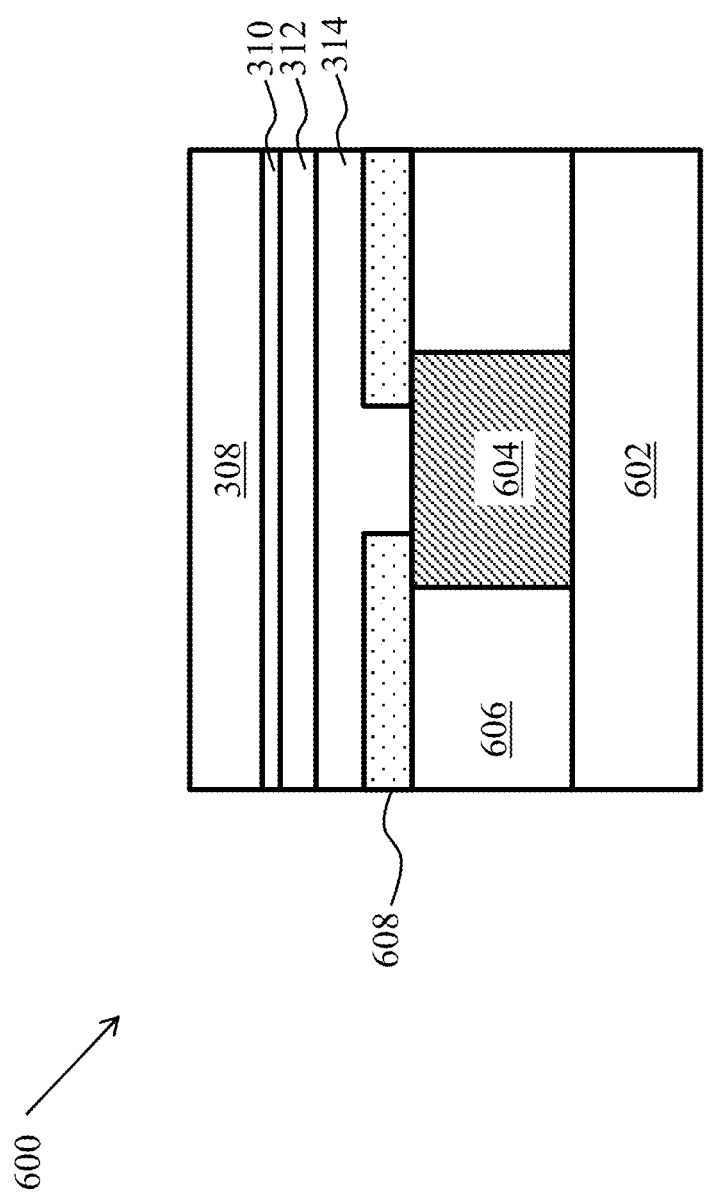
Figure 8:
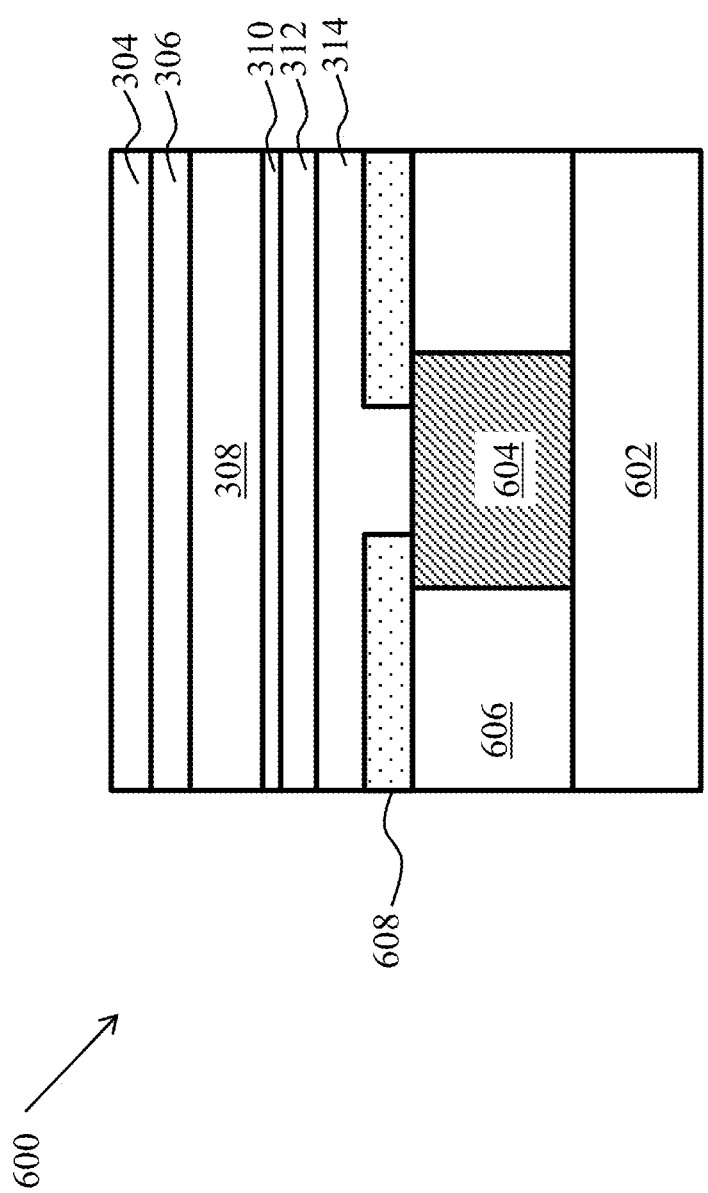
Figure 9:
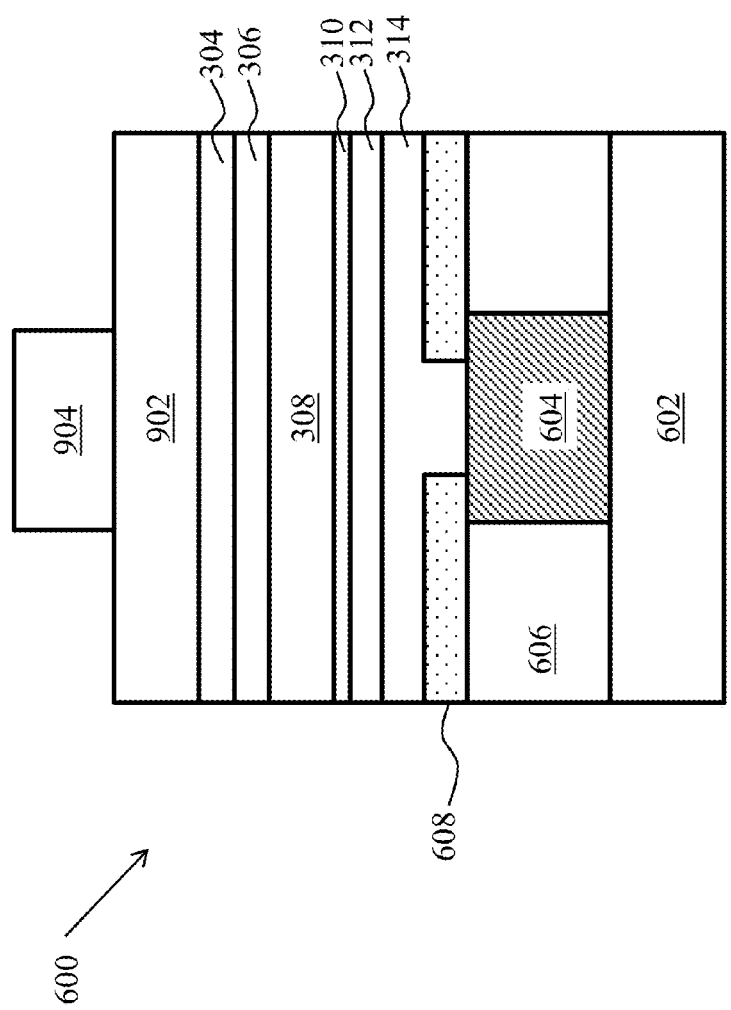
Figure 10:
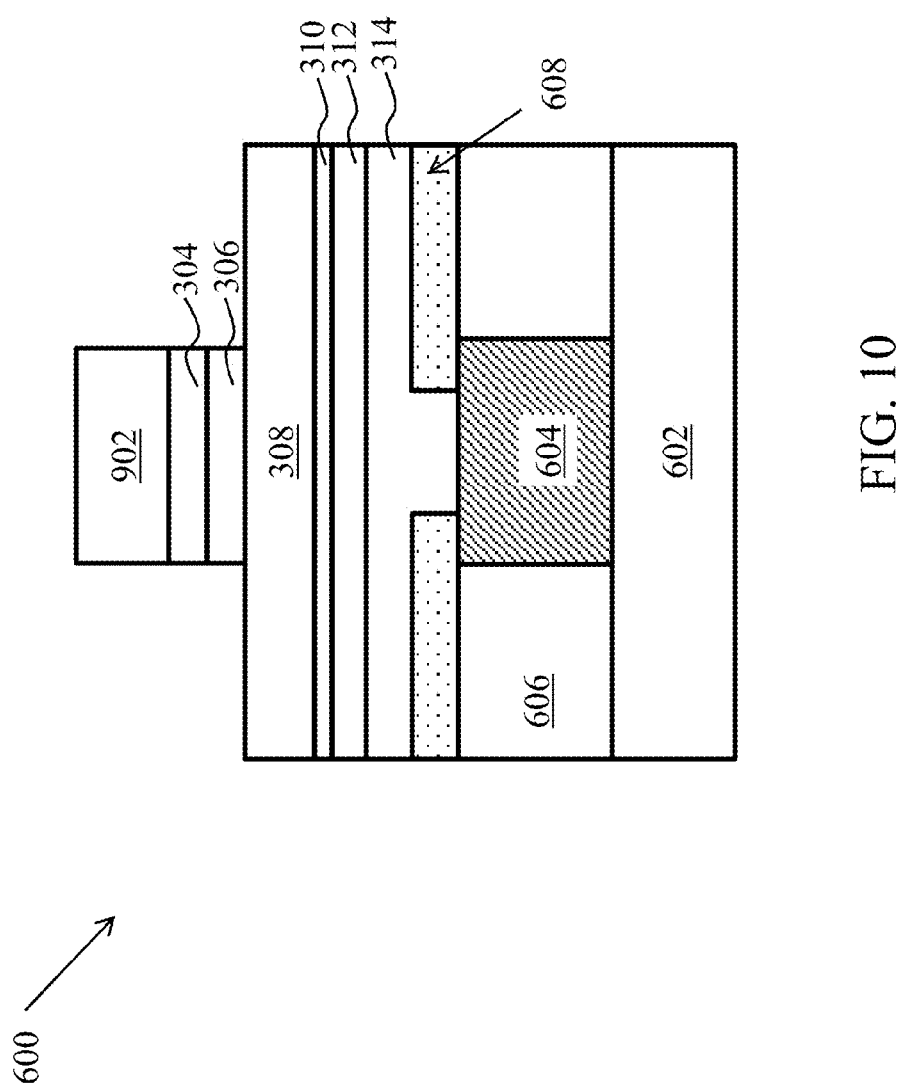
Figure 11:
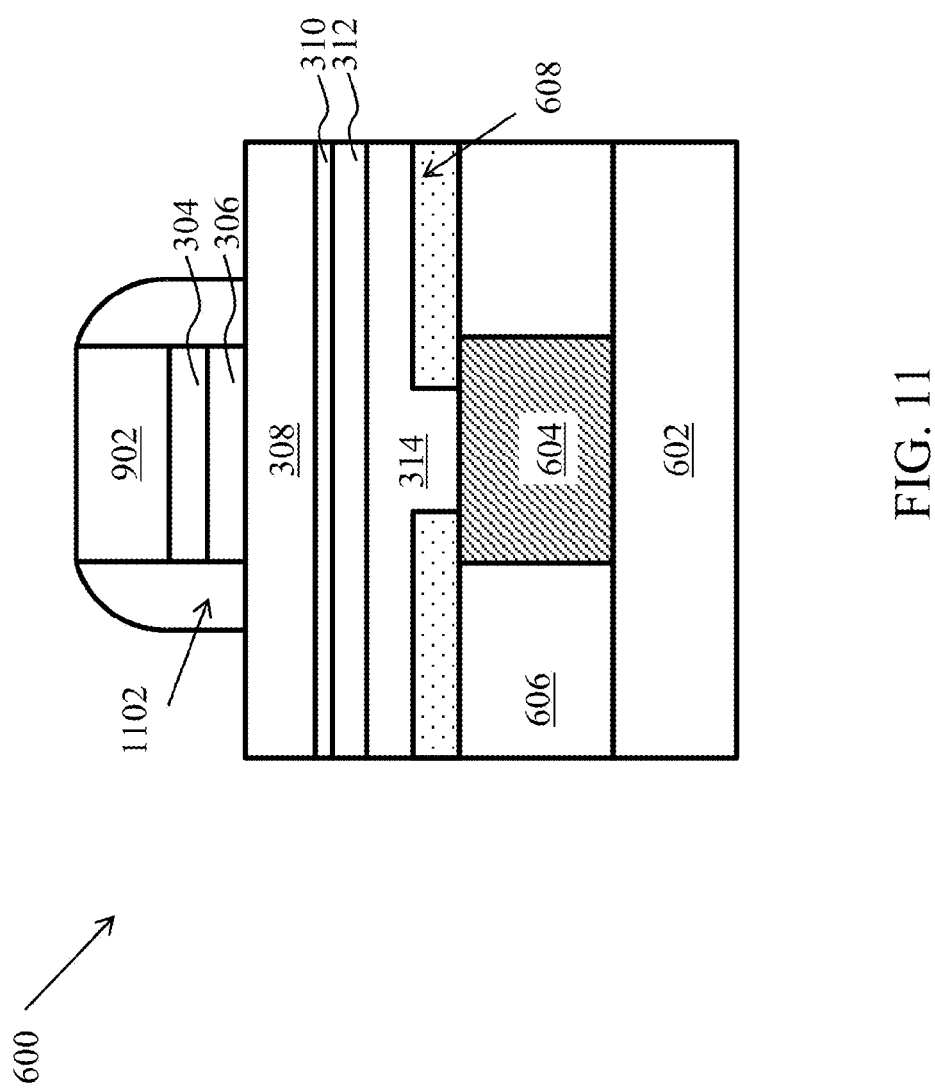
Figure 12:
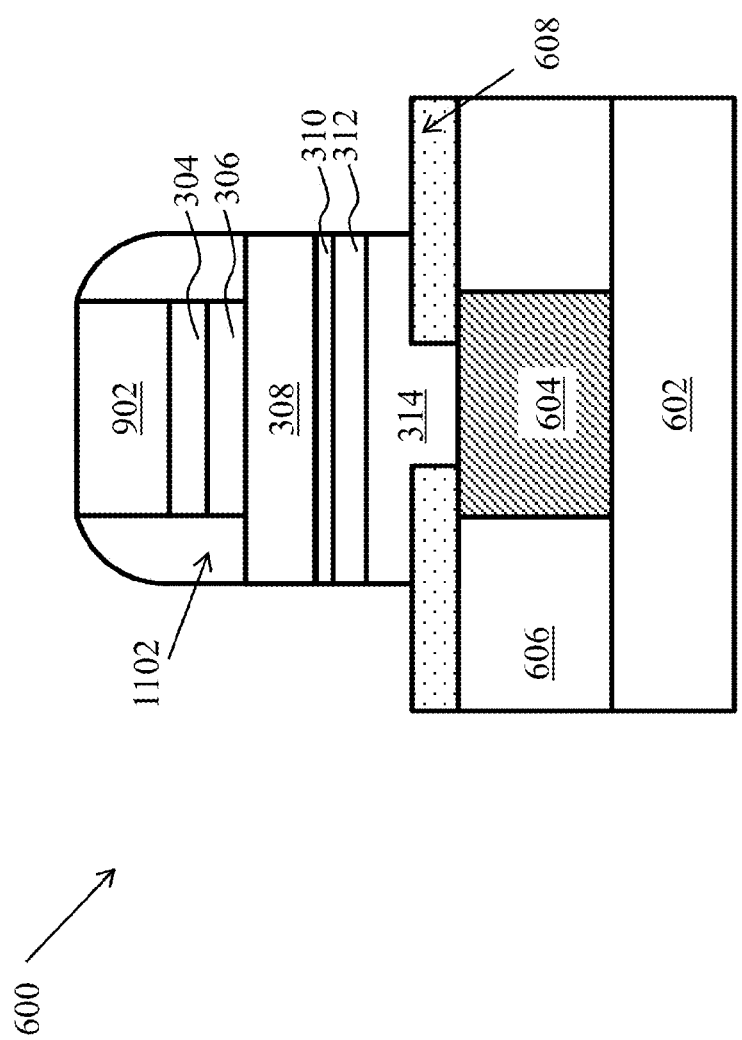
Figure 13:
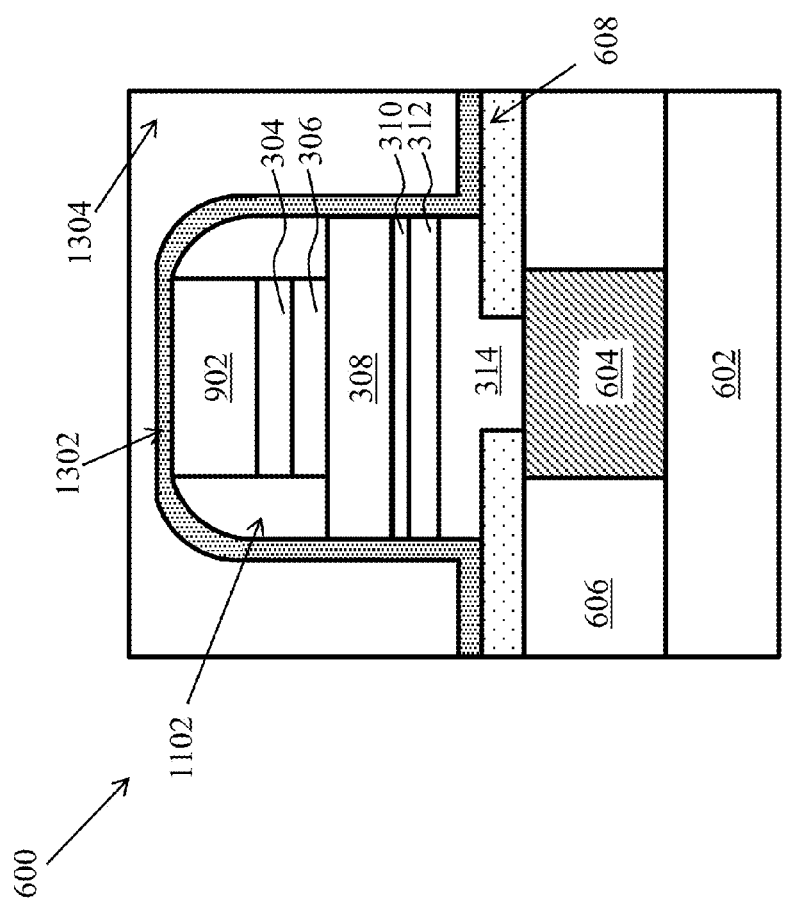
Figure 14:
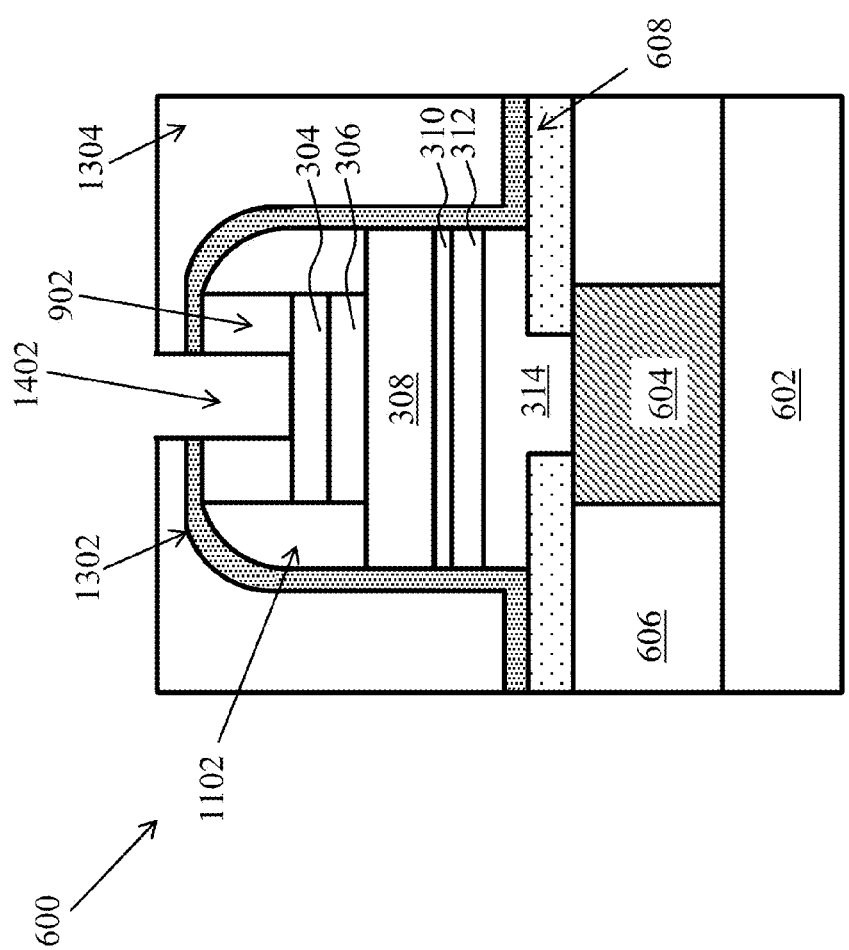
Figure 15:
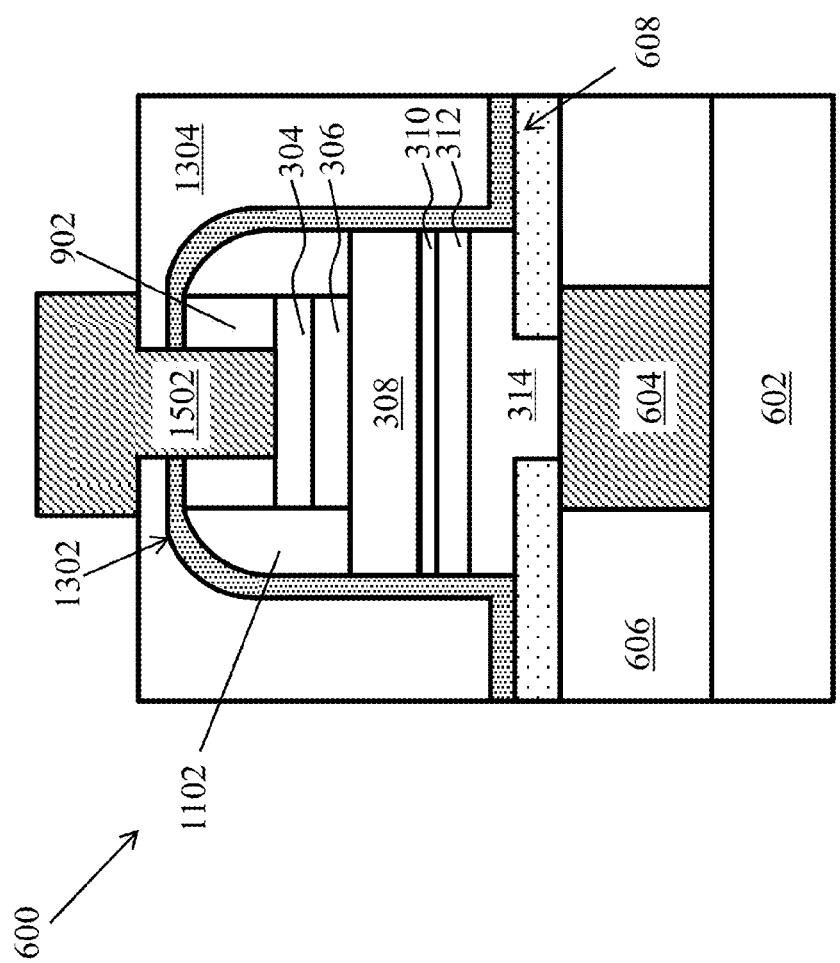

In particular, as illustrated in the example of FIG. 6, on the substrate 602 is formed an interconnect layer 604 disposed in an interlayer dielectric layer (ILD layer) 606. The interconnect or metallization layer 604 may be a conductive line, contact, or via. In an embodiment, the metallization layer 604 includes copper. Other examples include W, Al, Ti, Ta, and/or other suitable conductive compositions. In an embodiment, the metallization layer 604 further includes a barrier or adhesion layer. The metallization layer 604 may be formed by suitable photolithography, etching, and/or deposition processes. In an embodiment, the ILD layer 606 is extra-low k (ELK) dielectric. Suitable low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples. Other exemplary compositions for the ILD layer 606 include silicon oxide or silicon nitride. A process of forming the ILD layer 606 may utilize chemical vapor deposition (CVD), a spin-on coating or other suitable deposition technology. In an embodiment, the metallization layer 604 is a conductive line at the fourth (M4) level of the BEOL metallization; however, other locations are also possible.

The method 500 then proceeds to step 504 where a barrier layer and/or a bottom electrode are formed on the substrate. The barrier layer may be substantially similar to the barrier layer 314, described above with reference to FIG. 3. The bottom electrode may be substantially similar to the bottom electrode 312, described above with reference to FIGS. 3, and 4, and/or the bottom electrode 204, described above with reference to FIG. 2. Referring to the example of FIG. 6, a barrier layer 314 and a bottom electrode 312 are formed on the substrate 602. In an embodiment, an insulating layer 608 may interpose the barrier layer 314 and the metallization layer 604 and/or the ILD layer 606. The insulating layer 608 may be $SiO_2$, silicon nitride, silicon oxynitride, and/or other suitable dielectric composition. The insulating layer 608 may be formed by chemical vapor deposition (CVD), spin-on deposition, and/or other suitable deposition processes. The insulating layer 608 may be patterned to provide an opening to the metallization layer 604.

The barrier layer 314 may include TaN, TiN, HfN, ZrN, WN, NbN, MoN, combinations thereof, and/or other suitable conductive material. The barrier layer 314 may be formed by chemical vapor deposition (CVD), atomic layer deposition (ALD), physical vapor deposition (PVD), plating, and/or other suitable deposition processes.

The bottom electrode 312 may include TaN, TiN, HfN, ZrN, WN, NbN, MoN, and/or other suitable conductive material. The barrier layer 312 may be formed by chemical vapor deposition (CVD), atomic layer deposition (ALD), physical vapor deposition (PVD), plating, and/or other suitable deposition processes. In an embodiment, the barrier layer 314 is the same composition as the bottom electrode 312. In an embodiment, the barrier layer 314 is a different composition than the bottom electrode 312. Thus, in some embodiments, the barrier layer 314 is formed in situ with the bottom electrode 312. The bottom electrode 312 (or the bottom electrode 312 and the barrier layer 314) may be substantially similar to the bottom electrode 204, described above with reference to FIG. 2 and/or the bottom electrode 312 as described above with reference to FIGS. 3 and 4.

The method 500 then proceeds to block 506 where a nitrogen-rich region is formed on the bottom electrode. In an embodiment, block 506 and at least portions of block 504 are performed in-situ. For example, in conjunction with forming the bottom electrode, a nitrogen-rich region is formed on, at, and/or within the surface region of the bottom electrode. In an embodiment, a nitrogen or $NH_3$ plasma treatment, also referred to as a nitridation step, is performed on a surface of the bottom electrode to form the nitrogen-rich region. In a further example, a surface of the bottom electrode is metal (e.g., Ti) rich prior to the nitridation, which transforms the surface region to a nitrogen-rich composition. In an embodiment, the nitrogen-rich region is formed by controlling the nitrogen (for example $NH_3$) precursor flow rate during the deposition of the metal nitride used to form the bottom electrode. For example, after forming the bottom electrode of a desired thickness, the nitrogen flow rate is increased such that a nitrogen-rich region is formed thereon.

Referring to the example of FIG. 6, the nitrogen-rich region 310 is disposed on the bottom electrode 312. The nitrogen-rich region 310 includes a higher atomic percentage of nitrogen than the underlying bottom electrode 312, as discussed in further detail below.

The nitrogen-rich region 310 may be substantially similar to the nitrogen-rich region 214 of the MIM capacitor 200, described above with reference to FIG. 2 and/or the nitrogen-rich region 310 as described with reference to FIGS. 3 and 4. In an embodiment, the nitrogen-rich region 310 has at least a 5% greater atomic percentage of nitrogen than the bottom electrode 312. In an embodiment, the nitrogen-rich region 310 has a nitrogen-rich metal nitride composition of $XN_x$, where x is greater than stoichiometric value. For example, in an embodiment, the metal X is Ti and the nitrogen-rich metal nitride composition is $TiN_x$ where x is greater than 1. The excess nitrogen in the nitrogen-rich region 310 may include an excess of nitrogen of between greater than 0 and 10%, as compared to stoichiometric nitrogen atomic percentages. In an embodiment, the nitrogen-rich region 310 includes TiN excess N over the stoichiometric TiN, or $TiN_x$, where x is approximately 1.2.

Other exemplary metals for the nitrogen-rich region 310 and/or the bottom electrode 312 include Ta, Hf, Xr, W, Nb, Mo, and/or other suitable compositions. In some embodiments, the electrode 312 has the same metal as the nitrogen-rich region 310. In other embodiments, the electrode 312 has a different metal than the nitrogen-rich region 310.

In an embodiment, the nitrogen-rich region 310 is between approximately 10 and approximately 20 Angstroms in thickness. In an embodiment, the electrode 312 (e.g., metal-rich metal nitride) is between approximately 50 and 150 Angstroms.

In an embodiment, the nitrogen-rich region 310 is formed by a nitrogen or $NH_3$ plasma treatment, also referred to as a nitridation, on a surface region of the bottom electrode 312 to form the nitrogen-rich region 310. In a further example, a surface of the bottom electrode 312 is metal (e.g., Ti) rich prior to the nitridation, which transforms the surface region to a nitrogen-rich composition thereby transforming a region of the bottom electrode 312 as deposited into the nitrogen-rich region 310. In an embodiment, the nitrogen-rich region 310 is formed by controlling the nitrogen (for example $NH_3$) precursor flow rate during the deposition of the metal nitride used to form the bottom electrode 312. For example, after forming the bottom electrode 312 of a desired thickness, the nitrogen flow rate is increased such that a nitrogen-rich region 310 is formed on top of the bottom electrode 312.

The method 500 then proceeds to block 508 where a resistive or dielectric layer that may be used to form the switching function of the device is deposited on the substrate. The dielectric layer formed will, during operation of the MIM capacitor, form the conductive filament that provides for the resistive change necessary to change the state of the device (e.g., high resistance, low resistance). Referring to the example of FIG. 7, a dielectric layer 308 is formed on the nitrogen-rich region 310. In an embodiment, the dielectric 308 directly interfaces the nitrogen-rich region 310. In an embodiment, the dielectric layer 308 may be substantially similar to the switching element 208 of the MEM capacitor 200, described above with reference to FIG. 2 and/or the dielectric 308 described with reference to FIGS. 3 and 4. For example, the dielectric layer 308 may be a high-k dielectric layer such as HfO, $Ta_2O_5$, $Nb_2O_5$, $V_2O_5$, AlO, TiO, TaTiO, HfAlO, HfTaO, TaAlO, NbO/HfO, VO/HfO, TaO/HfO, AlO/HfO, TaO/AlO, and/or other suitable dielectrics. A variety of suitable processes including chemical vapor depositions (CVD), low-pressure CVD (LP-CVD), plasma-enhanced CVD (PECVD), and atomic layer deposition (ALD) may be used to form the dielectric layer 308.

The method 500 then proceeds to block 510 where a capping layer and top electrode are formed on the substrate. Referring to the example of FIG. 8, a capping layer 306 and a top electrode 304 is formed on the dielectric layer 308. The top electrode 304 may include TiN, Pt, TaN, Ir, W, combinations thereof, and/or other suitable conductive material. The top electrode 304 may be substantially similar to the top electrode 202 of the MIM capacitor 200 and/or the top electrode 304 described with reference to FIGS. 3 and 4. Exemplary compositions for the capping layer 306 include Ti, Hf, Al, Ta, and/or other suitable materials. The top electrode 304 and/or the capping layer 306 may be formed using CVD, ALD, PVD, plating, and/or other suitable deposition processes. The capping layer 306 may be operable to provide an oxygen reservoir used during the switching function of the device 600, including as described above with reference to FIG. 2.

The method 500 then proceeds to block 512 where a patterned masking element is formed over the stack of materials including those described in blocks 504, 506, 508, and 510. In an embodiment, the patterned masking element includes a photoresist and/or hard mask layer. Referring to the example of FIG. 9, a patterned photoresist element 904 and hard mask layer 902 are disposed over the substrate 602. As illustrated, the hard mask layer 902 is a conformal layer, however, the hard mask layer 902 may be patterned in subsequent etching steps including those using the photoresist element 904 as a masking element. The hard mask layer 902 may include silicon oxide, silicon nitride, silicon oxynitrides, silicon carbides, and/or other suitable compositions. The hard mask layer 902 may be formed by CVD, PVD or other suitable deposition processes. The patterned photoresist element 904 may be formed by deposition (e.g., spin on coating) of a resist, followed by suitable exposure, baking, and developing processes.

The method 500 then proceeds to block 514 where the masking element formed in block 512 is used to as a masking element during the etching of the top electrode and capping layer, described above with reference to block 510. The etching may include a plasma etch, dry etch and/or other suitable etching process or processes. Referring to the example of FIG. 10, the top electrode 304 and capping layer 306 have been etched using the photoresist 904 as a masking element. The photoresist 904 may be removed after or currently with the etch.

The method 500 then proceeds to block 516 where spacer elements are formed on the etched layers. For example, the spacer elements may be formed on the exposed sidewalls of the capping layer, top electrode, and/or hard mask layer. The spacer elements may include a dielectric material such as silicon oxide, silicon nitride, and/or other suitable material. The spacer elements may be formed by a deposition of the spacer material followed by an etch back of the material to form the spacers. Referring to the example of FIG. 11, the spacer elements 1102 are formed and disposed on the sidewalls of the etched top electrode 304 and capping layer 306. The spacer elements 1102 may have a composition that provides etch selectivity to the etched layers including the dielectric 308.

The method 500 then proceeds to block 518 where an additional etching process(es) is/are performed to patterning the remaining layers of the MIM capacitor stack using the spacer elements are as masking element. (The remaining hard mask may also be used as a masking element during the etching process.) The dielectric layer (described above with reference to block 508), the nitrogen-rich region (described above with reference to block 506), the bottom electrode and barrier layer (described above with reference to block 504) may each be etched in one or more etching processes using the spacer elements as a masking element. Referring to the example of FIG. 12, the barrier layer 314, bottom electrode 312, nitrogen-rich region 310, and dielectric layer 308 have each been etched using the spacer elements 1102 as masking elements.

The method 500 then proceeds to block 520 where insulating layer(s) are formed on the substrate. Referring to the example of FIG. 13, an insulating layer 1302 and an ILD layer 1304 are formed on the substrate. The insulating layer 1302 may be a conformal layer over the MIM capacitor stack. The ILD layer 1304 may be a dielectric layer of the multi-layer interconnect providing insulating properties to the metallization lines, vias, and/or contacts. The ILD layer 1304 and the insulating layer 1302 may be substantially similar to as discussed above with reference to the layers 606 and 608 respectively with reference to block 502 and FIG. 6.

The method 500 then proceeds to block 522 where a connection by a conductive element is provided to the stack of layers forming the MIM capacitor. The connection may be formed by etching an opening in the insulating layer(s) and filling the opening with a conductive material. In an embodiment, the opening on feature of numerous openings formed in fabricating a via or metallization layer of a MLI structure formed on the substrate. Referring to the example of FIG. 14, an opening 1402 is formed in the insulating layer 1302, the ILD layer 1304 and the hard mask layer 902 such that a top surface of the top electrode 304 is exposed. The opening may be formed by plasma etching, dry etching, and/or other suitable processes including using an appropriate masking element (not shown). In an embodiment, the opening is formed as part of a damascene (or dual-damascene) process. Referring to the example of FIG. 15, this opening is then filled with conductive material 1502. The conductive material 1502 may be W, Cu, Al, and/or other suitable conductive material. In an embodiment, the conductive material 1502 forms a via and/or an overlying metallization line.

Additional steps may be performed including providing a voltage to the MIM capacitor device 600 through the conductive material 1502 and forming a filament in the dielectric layer 308 to provide for resistive switching as discussed above with reference to FIG. 2.

Figures 16A, 16B:
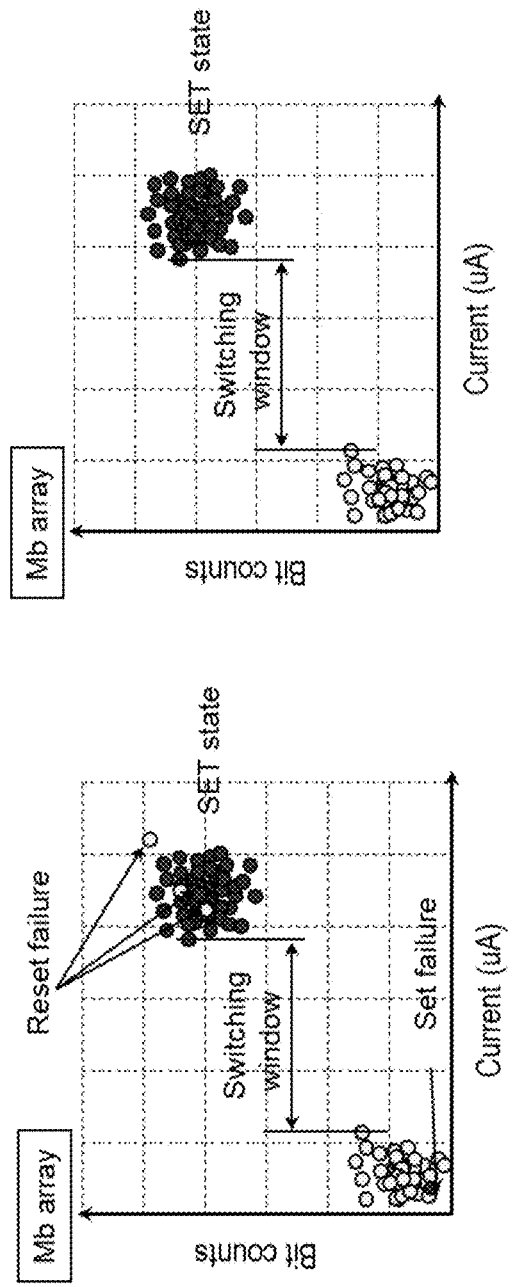
FIGS. 16A, 16B, 17, 18A, and 18B illustrate graphical representations of a comparison of performance between differently composed RRAM devices.

Referring now to FIGS. 16A and 16B, illustrated are results from experimental embodiments graphically illustrating a y-axis of bit counts and an x-axis of current in microamperes (μA). FIG. 16A illustrates a MIM capacitor RRAM device without a nitrogen-rich region, for example, a device such as depicted in FIG. 1. FIG. 16B illustrates a MIM capacitor RRAM device with a nitrogen-rich region, for example, a device such as illustrated in FIGS. 2, 3, 4, and as discussed with reference to the method 500 of FIG. 5. In particular, FIG. 16B illustrates an embodiment of a nitrogen-rich TiN region. FIG. 16A provides for an embodiment with a TiN electrode being in contact with the insulating region (e.g., filament). A comparison of FIGS. 16A and 16B illustrates that there are less set/reset failures in a device using nitrogen-rich region, which may provide higher memory device yield.

Figure 17:
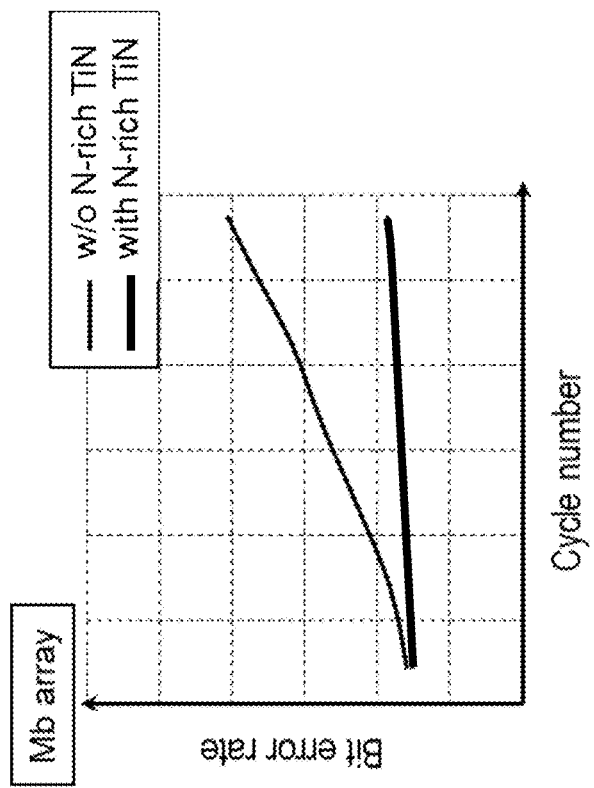

Referring now to FIG. 17, illustrated is graphical result from an experimental embodiment having a y-axis of bit error rate counts and an x-axis of a number of cycles. As illustrated, an embodiment of a MIM capacitor RRAM device without a nitrogen-rich region, such as illustrated in FIG. 1, provides for an increased bit error rate with an increased number of cycles as compared to an embodiment of a MIM capacitor RRAM device with a nitrogen-rich region such as illustrated in FIGS. 2, 3, 4, and as discussed with reference to the method 500 of FIG. 5. In an embodiment, the reduction for the nitrogen-rich region device in bit error rate is between approximately 2.5 times and 4 times that of an embodiment of a MIM capacitor RRAM device without the nitrogen-rich region.

Figures 18A, 18B:
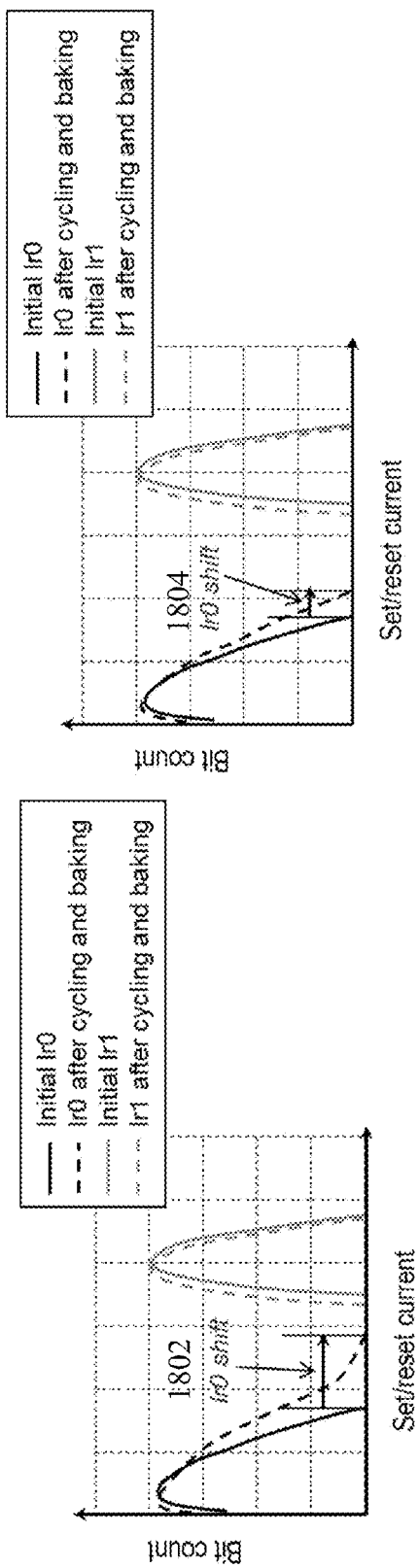

Referring now to FIGS. 18A and 18B, illustrated are graphical results from an experimental embodiment showing a y-axis of bit counts and an x-axis of set/reset current. FIG. 18A illustrates a MIM capacitor RRAM device without a nitrogen-rich region, for example a device such as depicted in FIG. 1. In FIG. 18A, a shift 1802 in the current is provided after cycling and baking the device. FIG. 18B illustrates a MIM capacitor RRAM device with a nitrogen-rich region such as illustrated in FIGS. 2, 3, 4, and as discussed with reference to the method 500 of FIG. 5. In FIG. 18B, a significant reduction in current shift 1804 occurs after cycling and baking in comparison with FIG. 18A. In an embodiment, the current shift (e.g., Ir0, or current to reset to provide a logic "0") may be improved by approximately 1.5 to 2 times that of an embodiment of a MIM capacitor RRAM device without the nitrogen-rich region. In other words, current shift 1804 may be 1.5 to 2 times less than the current shift 1802.

The present disclosure provides various embodiments of MIM capacitor devices and methods to fabricate a metal-insulator-metal (MIM) capacitor. These devices and/or methods may provide for a nitrogen-rich layer adjacent the filament. Underling the nitrogen-rich region is the electrode having a lower nitrogen-concentration. In some embodiments, the nitrogen-rich layer provides for a reduction in an attraction of oxygen atoms or ions to the lower electrode during the operation of the MIM capacitor as an RRAM device. A reduction of the oxygen attraction may provide for maintaining a V-shape for the conductive filament of the RRAM device reducing the degradation of the conductive filament during the stressing (e.g., cycling and baking) or operation of the RRAM device. The performance of the RRAM device may illustrate an improvement in the bit error rate.

Thus, in an embodiment provided is a metal-insulator-metal (MIM) capacitor structure including a first electrode and a second electrode and an insulating layer interposing the first and second electrodes. Further, a nitrogen-rich metal layer interposing the second electrode and the insulating layer. The MIM capacitor may be an RRAM device providing a conductive filament or switching element in the insulating layer.

In another embodiment, a MIM capacitor of a resistive random access memory (RRAM) device is described that includes a top electrode disposed over a semiconductor substrate and a bottom electrode disposed between the top electrode and the semiconductor substrate. The bottom electrode includes a nitride of a first metal. A dielectric layer interposes the top and bottom electrodes and is operable to form a conductive filament during operation of the RRAM device. A metal nitride layer is formed between the bottom electrode and the dielectric layer. The metal nitride layer includes a nitride of the first metal and has a greater atomic percentage of nitrogen than the bottom electrode.

Yet in another embodiment of the present disclosure, described is a method that includes providing a semiconductor substrate. The method continues to form a metal-insulator-metal capacitor over the semiconductor substrate, wherein the forming the MIM capacitor includes depositing a bottom electrode over a semiconductor substrate having a first nitrogen concentration and forming a region on the bottom electrode having a second nitrogen concentration, greater than the first nitrogen concentration. A dielectric layer is then deposited on the region; and a top electrode is formed over the dielectric layer.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure, comprising:
   a first electrode and a second electrode, wherein the second electrode is a metal-rich metal nitride layer;
   an insulating layer interposing the first and second electrodes, wherein the insulating layer is operable to form a conductive filament of oxygen vacancies in the insulating layer during operation of a resistive random access memory (RRAM) device including the MIM capacitor structure; and a nitrogen-rich metal layer interposing the second electrode and the insulating layer.

2. The MIM capacitor structure of claim 1, wherein the nitrogen-rich metal layer includes greater than 5% excess nitrogen.

3. The MIM capacitor structure of claim 1, wherein the nitrogen-rich metal layer is nitrogen-rich TiN and the second electrode is Ti-rich TiN.

4. The MIM capacitor structure of claim 1, wherein the insulating layer is a high-k dielectric.

5. The MIM capacitor structure of claim 1, further comprising:
a capping layer interposing the insulating layer and the first electrode.

6. The MIM capacitor structure of claim 1, wherein the nitrogen-rich metal layer is selected from the group consisting of TiN, TaN, HfN, ZrN, WN, NbN, MoN, and combinations thereof.

7. The MIM capacitor structure of claim 1, wherein the first electrode is a metal-rich metal nitride having a first type of metal and the nitrogen-rich metal layer is a metal nitride having the first type of metal.

8. The MIM capacitor structure of claim 1, wherein the second electrode is the metal-rich metal nitride layer having a first nitrogen-concentration, wherein the first nitrogen concentration is substantially constant from a top surface to a bottom surface of the second electrode, and wherein the nitrogen-rich metal layer has a second nitrogen-concentration greater than the first nitrogen-concentration.

9. A MIM capacitor of a resistive random access memory (RRAM) device, comprising:
a top electrode disposed over a semiconductor substrate;
a bottom electrode disposed between the top electrode and the semiconductor substrate, wherein the bottom electrode includes a first composition of a nitride of a first metal, wherein the first composition is a metal-rich metal nitride;
a dielectric layer interposing the top and bottom electrodes, wherein the dielectric layer is operable to form a conductive filament during operation of the RRAM device; and
a metal nitride layer formed between the bottom electrode and the dielectric layer, wherein the metal nitride layer includes a second composition of a nitride of the first metal wherein the second composition is a nitride-rich metal nitride and has a greater atomic percentage of nitrogen than the bottom electrode.

10. The MIM capacitor of claim 9, wherein the metal nitride layer directly interfaces the bottom electrode.

11. The MIM capacitor of claim 9, wherein the metal nitride layer directly interfaces the dielectric layer.

12. The MIM capacitor of claim 9, wherein the first metal is one of Ta, Ti, Hf, Zr, W, Nb, Mo, and combinations thereof.

13. The MIM capacitor of claim 9, wherein the greater atomic percentage of nitrogen of the metal nitride layer includes at least 5% greater atomic percentage than the bottom electrode.

14. The MIM capacitor of claim 9, wherein the atomic percentage of nitrogen in the metal nitride layer is between approximately 1.0 and approximately 1.1 and an atomic percentage of nitrogen in the bottom electrode is between approximately 0.90 and approximately 0.98.

15. The MIM capacitor of claim 9, wherein the bottom electrode is titanium-rich TiN and the metal nitride layer is nitrogen-rich TiN.

16. A method, comprising:
providing a semiconductor substrate; and
forming a metal-insulator-metal capacitor over the semiconductor substrate, wherein the forming the MIM capacitor includes:
depositing a barrier layer directly on an interconnect layer disposed over the semiconductor substrate, wherein the barrier layer has a first metal composition;
depositing a bottom electrode over a semiconductor substrate wherein the bottom electrode has a second metal composition different than the first metal composition and has a first nitrogen concentration, wherein a bottom surface of the bottom electrode having the first second metal composition and the first nitrogen concentration is formed interfacing the barrier layer;
after or concurrently with depositing the bottom electrode, forming a region on the bottom electrode having a second nitrogen concentration, greater than the first nitrogen concentration;
depositing a dielectric layer on the region; and
forming a top electrode over the dielectric layer.

17. The method of claim 16, wherein the forming the region on the bottom electrode having the second nitrogen concentration includes performing a plasma treatment on the bottom electrode to increase a nitrogen content of a surface region of the bottom electrode.

18. The method of claim 16, wherein the forming the region on the bottom electrode having the second nitrogen concentration includes:
forming the bottom electrode by a deposition process using a first nitrogen flow rate; and
thereafter, continuing the deposition process using a second nitrogen flow rate, wherein the second nitrogen flow rate is greater than the first nitrogen flow rate.

19. The method of claim 16, further comprising:
providing a voltage to the MIM capacitor to form a conductive filament in the dielectric layer.

20. The method of claim 16, further comprising:
forming the interconnect layer of copper disposed in an interlayer dielectric layer (ILD).

* * * * *